(12) United States Patent
Silvestri

(10) Patent No.: US 7,327,592 B2
(45) Date of Patent: Feb. 5, 2008

(54) SELF-IDENTIFYING STACKED DIE SEMICONDUCTOR COMPONENTS

(75) Inventor: Paul Silvestri, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 51 days.

(21) Appl. No.: 11/215,648

(22) Filed: Aug. 30, 2005

(65) Prior Publication Data

US 2007/0047284 A1    Mar. 1, 2007

(51) Int. Cl.
*G11C 5/06* (2006.01)
(52) U.S. Cl. .................. 365/63; 365/230.06; 257/687; 438/109
(58) Field of Classification Search ............... 365/65, 365/230.06; 257/687; 438/109
See application file for complete search history.

(56) References Cited

U.S. PATENT DOCUMENTS 5,173,766 A * 12/1992 Long et al. ................ 257/687
5,291,061 A * 3/1994 Ball .......................... 257/686
6,168,973 B1 * 1/2001 Hubbard .................... 438/109
6,218,895 B1 * 4/2001 De et al. ................... 327/566
6,400,008 B1 * 6/2002 Farnworth .................. 257/698
6,696,318 B2 * 2/2004 Milla ......................... 438/108
6,706,557 B2 * 3/2004 Koopmans ................. 438/109
6,813,193 B2 * 11/2004 Vogelsang .............. 365/189.05

\* cited by examiner

*Primary Examiner*—Connie C. Yoha
(74) *Attorney, Agent, or Firm*—Wong, Cabello, Lutsch, Rutherford & Brucculeri LLP

(57) ABSTRACT

A semiconductor die having a functional circuit (e.g., a memory array) and a decode circuit suitable for use in a stacked die semiconductor component (e.g., a random access memory component) is described. The decode circuit permits individual die in a stacked die structure to automatically determine their location or position in the stack and, in response to this determination, selectively pass one or more external control signals (e.g., chip select and clock enable signals) to the decode circuit's associated functional circuit based on inter-die connection patterns. This "self-configuring" capability permits all die designated for a specified functionality (e.g., a memory module including four vertically aligned die) to be uniformly or consistently manufactured. This, in turn, can reduce the cost to manufacture stacked die components.

28 Claims, 3 Drawing Sheets

SELF-IDENTIFYING STACKED DIE SEMICONDUCTOR COMPONENTS

BACKGROUND

The invention relates generally to semiconductor devices and, more particularly, to stacked die semiconductor devices and to methods for uniquely identifying individual die within a stacked die structure.

Semiconductor devices are generally constructed from silicon or gallium arsenide wafers through a fabrication process that involves a number of deposition, masking, diffusion, etching, and implanting steps. Each fabrication run results in a wafer with a number of identical integrated circuit ("IC") devices formed therein. After fabrication, the wafer is separated into individual units or die, where each die includes one IC device. Traditionally, individual die are encased in a molding and electrically connected to leads that protrude therefrom. More recently, multiple die have been arranged within a single enclosure. In one such arrangement, two or more die are aligned vertically and electrically interconnected to form a single component. Components formed in this manner are said to employ stacked die or a stacked die structure.

Stacked die structures permit design engineers to increase a system's circuit density—the amount of circuitry per unit area of printed circuit board. Within a stacked die structure, however, it can be important that die are individually selectable. For example, when multiple memory circuit die are stacked to form a single memory component, it can be important that each die be individually activated or selected. In the past, this capability has been provided by remapping various control pins such as chip select and/or clock enable pins from each die within a stack through the use of fuses, anti-fuses and redistribution layers ("RDL"). While these approaches have proven successful, they require that die destined for a first position (e.g., the bottom-most die in a stack) be processed differently from a die destined for a second position (e.g., the top-most die in a stack). In addition to the added cost of processing die in this manner, each die that is different from another die must be segregated and tracked uniquely via a manufacturing parts tracking system, further adding to the cost of conventional stacked die devices. Thus, it would be beneficial to provide improved stacked die structures that utilize dies fabricated in a consistent manner and wherein such die would be capable of automatically sensing their position in a stacked die structure such that they are individually and uniquely selectable.

SUMMARY

The invention provides a semiconductor die having a functional circuit and a decode circuit suitable for use in a stacked die semiconductor component. The decode circuit permits individual die in a stacked die structure to determine their location or position in the stack and, in response, selectively pass one or more external control signals to the decode circuit's associated functional circuit based on inter-die connection patterns. Accordingly, stacked semiconductor die components may be assembled using consistently processed or fabricated semiconductor dies in accordance with the invention.

In one embodiment, a semiconductor die in accordance with the invention comprises a functional circuit having an enable input connection, a plurality of external control signal connections for receipt of control signals external to the die's package, a plurality of internal control signal input connections and a decode circuit. The decode circuit, in turn, comprises a first set of inputs coupled to the external control signal input connections, a second set of inputs coupled to the internal control signal input connections and an output coupled to the functional circuit's enable input connection. The decode circuit is configured to selectively route a signal coupled to the external control signal input connections to the decoder's output (and, therefore, the functional circuit's enable input connection) based on signals provided by the internal control signal input connections—the state of which is determined by the pattern of inter-die connections.

In another embodiment, a plurality of known good die in accordance with the invention are vertically stacked and electrically coupled to provide a component having a specified functionality. An illustrative functional circuit comprises a memory array, an illustrative stacked die component comprises a random access memory component and illustrative external control signals comprise chip select and clock enable signals.

DETAILED DESCRIPTION

Stacked die structures comprised of consistently fabricated die that automatically sense their position in the structure and are uniquely selectable through specified control signals are described. The following descriptions are presented to enable any person skilled in the art of semiconductor device design and fabrication to make and use the invention as claimed and are provided in the context of the particular examples discussed below, variations of which will be readily apparent to those skilled in the art. Accordingly, the claims appended hereto are not intended to be limited by the disclosed embodiments, but are to be accorded their widest scope consistent with the principles and features disclosed herein.

In accordance with the invention, a plurality of known good die are stacked and electrically coupled to provide a component having a specified functionality, wherein a plurality of external control pins are provided that permit the unique selection/activation of individual die within the stacked die structure. In a preferred implementation, four functionally identical and consistently manufactured memory die are stacked and interconnected. One type of exemplary memory device is a Synchronous Dynamic Random Access Memory ("SDRAM") device, such as SDRAM devices designed and manufactured by the Assignee of this document. It is to be understood, however, that this constitutes but one exemplary type of integrated circuit component that can be used in accordance with the inventive concept. Other types of integrated circuit devices (and not necessarily memory devices) can be provided without departing from the spirit and scope of the claimed subject matter.

Figure 1:
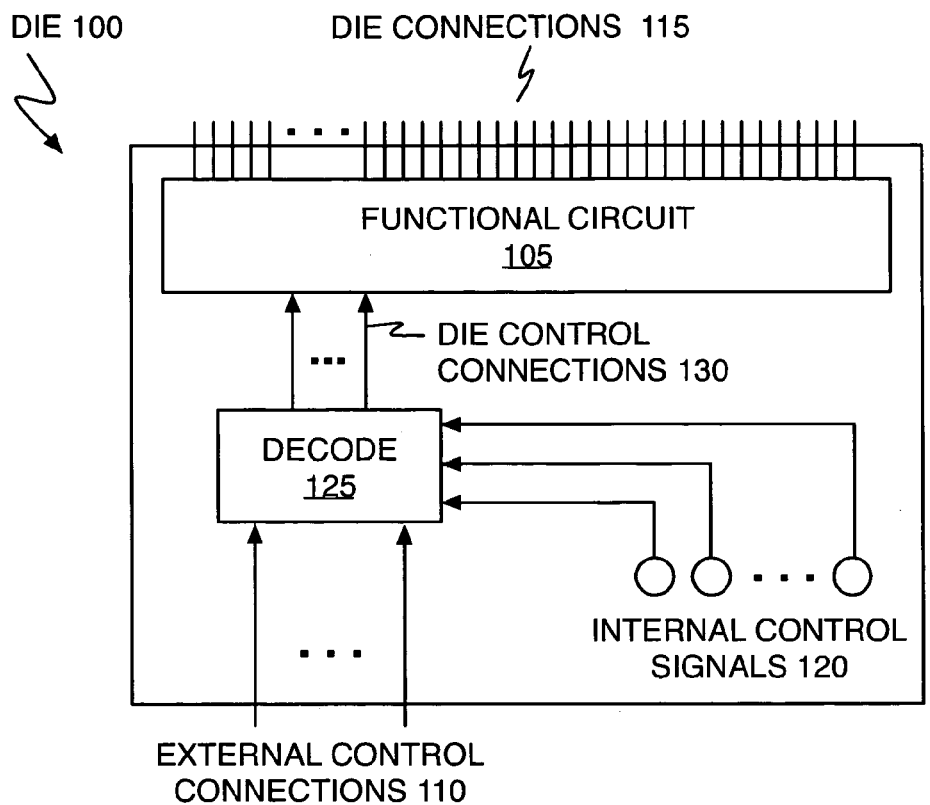
FIG. 1 shows, in block diagram form, a semiconductor die in accordance with one embodiment of the invention.

Referring to FIG. 1, die 100 in accordance with one embodiment of the invention comprises functional circuit 105 having external control connections 110 and die connections 115. For example, functional circuit 105 could implement a static, dynamic or flash memory array, external control connections 110 could include chip select and/or clock enable inputs and die connections 115 could include power, ground, address and data signals as well as other control signals and die testing connections. Internal control signals 120 represent signal paths that are used in accordance with the invention to supply decode circuit 125. As used herein, "internal control signals" are signals that arise from, and are used by, circuitry inside the target component—that is, from individual die within the component. Decode circuit 125, in turn, controls which one(s) of external control signals 110 are supplied to die control connections 130 (e.g., chip select and/or clock enable connections) for functional circuit 105.

In general, each die (e.g., die 100) for use in a specified stacked die structure component (e.g., a memory component) in accordance with the invention can be manufactured having the same internal control signal paths 120, decode circuitry 125 and connections between external control signals 110, decode circuit 125 and die control connections 130. During component fabrication, the pattern of connections between internal control signals 120 on a first die in a stack and its adjacent die(s) determine the input to decode circuit 125 on each die. In this way, and as well be described in detail below, decode circuit 125 uniquely conveys one or more signals input via external control connections 110 to functional circuit 105 depending upon the die's position in the stack structure.

Figure 2:
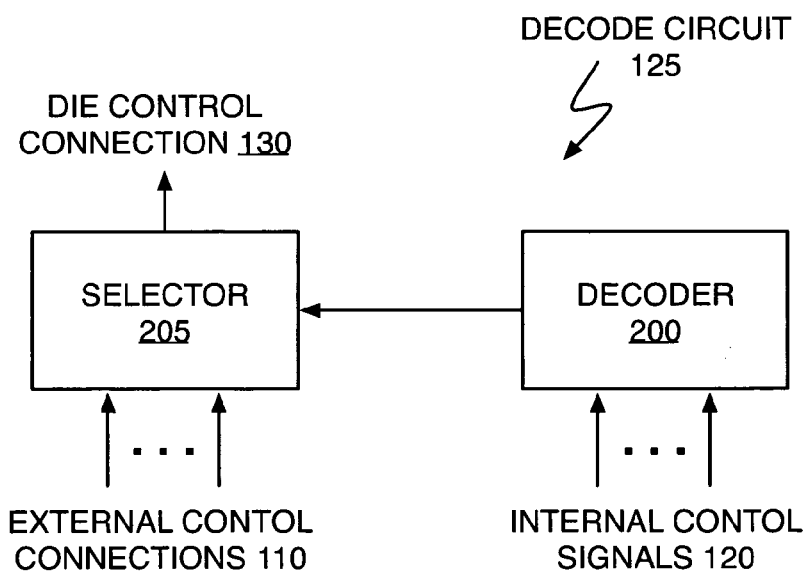
FIG. 2 shows, in block diagram form, the decode circuit of FIG. 1 in accordance with one embodiment of the invention.
Figure 3:
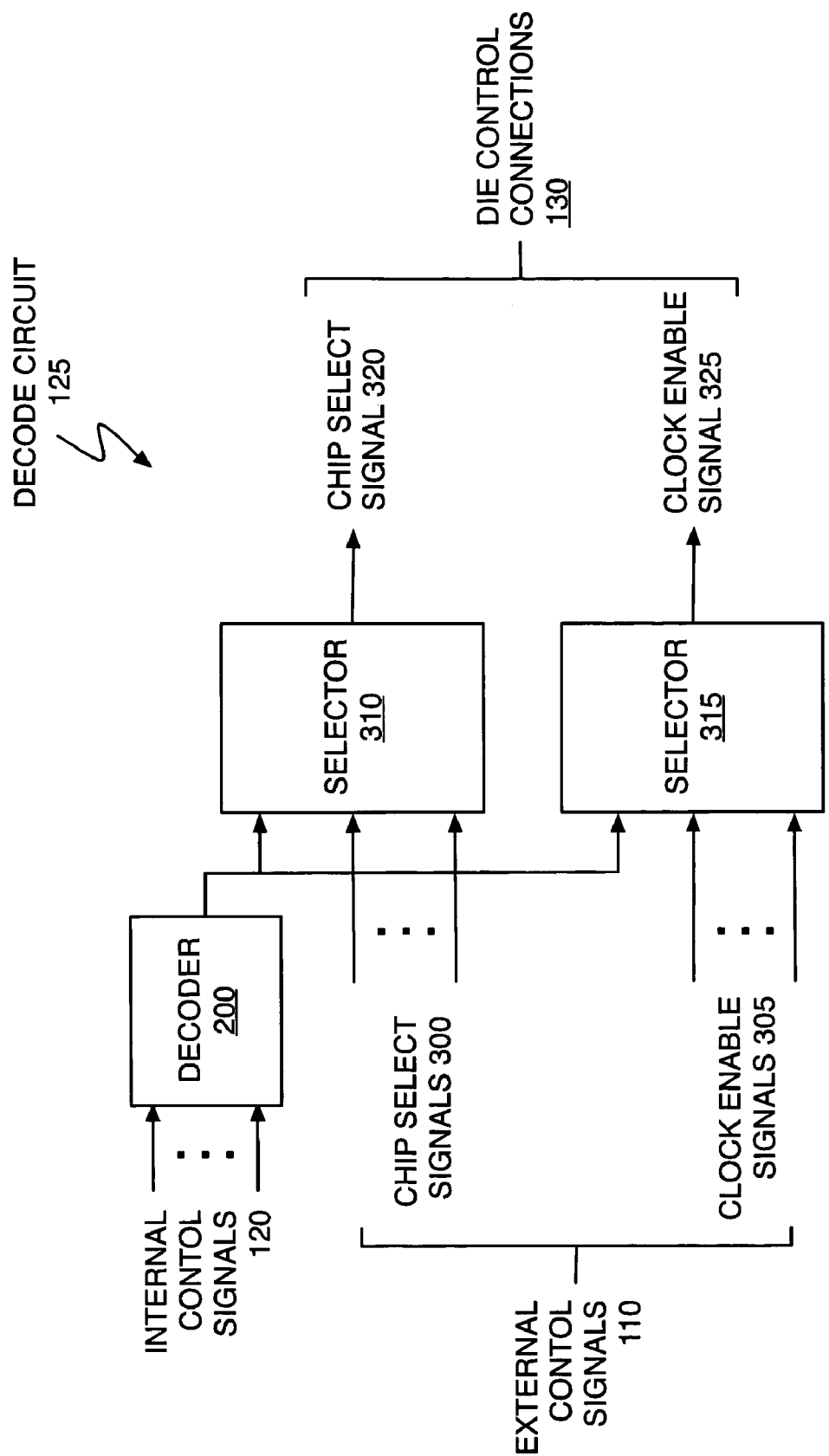
FIG. 3 shows, in block diagram form, the decode circuit of FIG. 1 in accordance with another embodiment of the invention.

Referring to FIG. 2, decode circuit 125 comprises decoder 200 and selector 205. In practice, decoder 200 "decodes" the pattern of its input signals (internal control signals 120) so as to cause selector 205 to pass one of its input signals (provided-via-external control connections 110) to its functional circuit (e.g., circuit 105) via die control connection 130. In one embodiment, there are as many external control signals as there are die in the stacked die structure. In a stacked die memory component, for example, external control connections 110 could convey one CHIP SELECT signal for each die in the stacked die structure. In this embodiment, die control connection 130 would provide a single CHIP SELECT signal. In another embodiment, there is a group of external control connections for each unique control signal that is to be provided to functional circuit 105. Referring to FIG. 3, for example, in a stacked die memory component external control connections 110 could convey a first group of CHIP SELECT signals 300 and a second group of CLOCK ENABLE signals 305. Each group of external control signals can drive its own selector, 310 and 315 respectively. Each selector, in turn, supplies a single output signal (CHIP SELECT signal 320 and CLOCK ENABLE signal 325), the collection of which are carried to functional circuit 105 via die control connections 130.

With respect to the described embodiments, it will be recognized that selectors 205, 310 and 315 act as N-to-1 multiplexers and that the number of internal control signals depends upon the number of die to be stacked. For example, if a stacked die component in accordance with the invention comprises eight (8) die, there can be as few as three (3) or as many as eight (8) internal control signals.

To facilitate the use of consistently processed die in accordance with the invention, it will be recognized that each die should have its internal control signals coupled during the die fabrication process in such a manner as to provide an initial value to the die's decoder circuit 125 when incorporated into a stacked die structure. In many semiconductor device environments, it is common to bias a die's connection pads to a weak ground potential. (By "weak," it is meant that the value may be readily over-ridden by a voltage level above the die's ground potential.) Using this feature, each internal control signal on a die manufactured in accordance with the invention may be individually coupled to a weak ground potential. When this is done, the final input to each die's decoder 200 can be set, determined or specified by the manner in which the die are interconnected at component fabrication time (see discussion below). This, in turn, permits each die's decode circuit 125 to uniquely select or enable its functional circuit 105 regardless of its position in the stacked die structure. That is, die in accordance with the invention automatically determine their location within a stacked die structure and activate, enable or select their functional circuitry based upon that location. Accordingly, stacked die components in accordance with the invention do not require that their constituent die be processed to include unique signal remapping features through, for example, extra semiconductor processing steps or post-processing operations such as the formation of redistribution layers.

Figure 4:
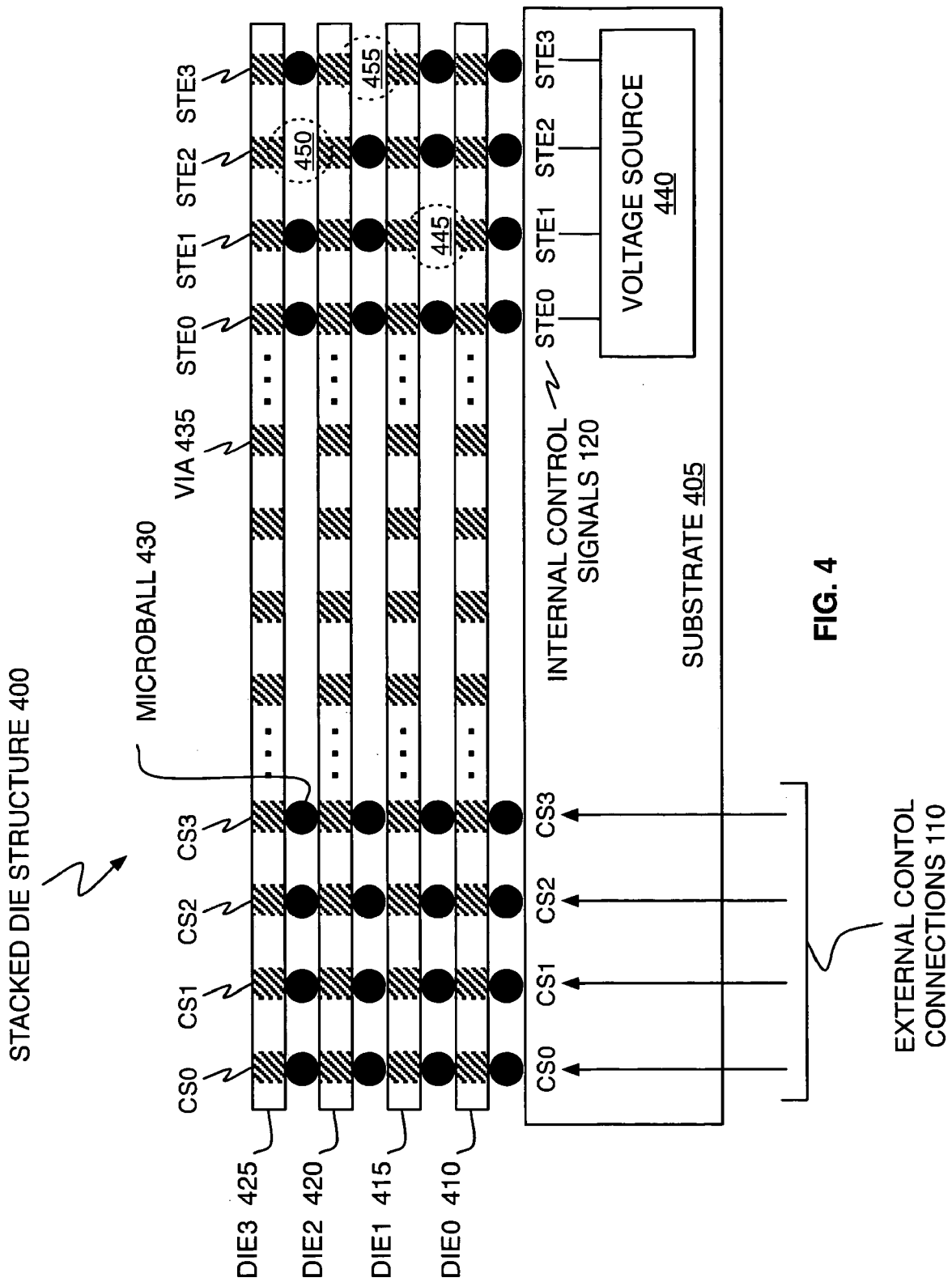
FIG. 4 shows, in block diagram form, a stacked die component in accordance with one embodiment of the invention.

Consider, by way of example, FIG. 4 in which a memory component employing stacked die structure 400 in accordance with one embodiment of the invention includes printed circuit board ("PCB") substrate 405, first die (DIE0) 410, second die (DIE1) 415, third die (DIE2) 420 and fourth die (DIE3) 425. In this embodiment, structure 400 utilizes microballs 430 (small solder beads) to interconnect the different die, each of which includes through wafer interconnect vias 435. It will be recognized that substrate 405 acts to provide structural support and electrical connectivity between the stacked die and the physical package within which stacked die structure 400 is placed. Illustrative PCB substrate materials include, but are not limited to, FR2, FR4 and plastics such as Rogers® 4000, Rogers® Duroid, DuPont® Teflon® (types GT and GX), polyimide, polystyrene and cross-linked polystyrene. It will further be recognized that inter-die connections may be made using technologies other than through wafer interconnects and microballs—e.g., wire bonds, flip-chips or combinations of these and other technologies. In addition, it may be desirable or necessary (depending upon the types of die and substrate used) to include a spacer or bonding layer (e.g., epoxy) between each die.

As illustrated, external control connections 110 convey CHIP SELECT 0 (CS0), CHIP SELECT 1 (CS1), CHIP SELECT 2 (CS2) and CHIP SELECT 3 (CS3) signals. Similarly, internal control signals 120 comprise STACK ENABLE 0 (STE0), STACK ENABLE 1 (STE1), STACK ENABLE 2 (STE2) and STACK ENABLE 3 (STE3) signals. As shown, each of the stack enable connections STE0-STE3 on PCB substrate 405 are electrically coupled to voltage source 440. When this is done in conjunction with connecting (during the die manufacturing process) each die's internal control signal's connection pad so that it is biased to a weak ground potential, permits internal control signal inter-die connection patterns (e.g., mircoballs and non-connections 445, 450 and 455) to provide a unique-collection of input signals to each decode circuit on each die and, as a consequence, permits the unique selection of die in accordance with external control connections 110.

Given the illustrative inter-die connection pattern of FIG. 4, Table 1 describes the functional operation of decode circuit 125. One of ordinary skill in the art will understand that the "logic" expressed in Table 1 is sufficient to define the operation of decode circuit 125 in accordance with the invention. Having said this, it will also be readily apparent to one of ordinary skill in the art that the illustrated logic is not the only logic possible. In accordance with the invention, any pattern of inter-die connectivity that provides a unique set of internal control inputs 120 to each die's decode circuit 125 can be used—Table 1 represents but one possible pattern.

TABLE 1

Illustrative Decode Circuit Function

| STE0 | STE1 | STE2 | STE3 | Die Selected |
|------|------|------|------|--------------|
| 1 | 1 | 1 | 1 | DIE0 |
| 1 | 0 | 1 | 1 | DIE1 |
| 1 | 0 | 1 | 0 | DIE2 |
| 1 | 0 | 0 | 0 | DIE3 |

Benefits of the invention include the ability to use any die manufactured in accordance with the invention in any position in a stacked die structure. By selectively interconnecting internal control signal paths between the die in a stack, each die's decode circuit can uniquely select, activate or enable its associated functional circuit. Accordingly, stacked die structure components in accordance with the invention can be assembled from a die manufactured in a consistent manner—since all die for use in a specified stacked die component are the same, no special processing (e.g., formation of redistribution layers) or additional tracking of unique parts are needed during manufacture time. This, in turn, reduces the cost to manufacture such components and improves the overall yield through the elimination of processing steps. (It will be recognized that the amount of circuitry needed to implement decode circuit 125 is de minimus compared to the amount of circuitry (e.g., number of transistors) required to implement functional circuitry 105.

Various changes in the materials, components and circuit elements of the illustrated embodiments are possible without departing from the scope of the following claims. For instance, stacked die structures in accordance with the invention are not limited to the illustrative four die component of FIG. 4. Similarly, components employing a stacked die in accordance with the invention are not limited to utilizing a single group of external control signals as illustrated in FIG. 4. For example, each die in an SDRAM stacked die component in accordance with the invention may selectively pass both CHIP SELECT and CLOCK ENABLE signals to their respective functional circuit (e.g., see FIG. 3). Other combinations of control signals for die embodying different functional circuits will be readily apparent to those of ordinary skill in the art. In addition, stacked die structures in accordance with the invention are not limited to memory components or, even, the use of die having the same functional circuits (e.g., element 105 in FIG. 1). As long as die having different functional circuits are fabricated to include decode circuit and internal control signals in the manner described herein, die with different functional circuits may be used to assemble stacked die components in accordance with the invention.

What is claimed is:

1. A semiconductor die, comprising:
 a functional circuit having an enable input connection;
 a plurality of external control signal input connections;
 a plurality of internal control signal input connections; and
 a decode circuit having a first plurality of inputs coupled to the external control signal input connections, a second plurality of inputs coupled to the internal control signal input connections and an output coupled to the enable input connection, wherein the decode circuit is adapted to couple one signal coupled to the external control signal input connections to the output based on signals coupled to the internal control signal input connections, and wherein the signals coupled to the internal control signal input connections are indicative of the semiconductor die's location in a stacked die structure.

2. The semiconductor die of claim 1, wherein the functional circuit comprises a memory array.

3. The semiconductor die of claim 2, wherein the memory array comprises a random access memory array.

4. The semiconductor die of claim 2, wherein each of the plurality of external control signal input connections are adapted to receive a CHIP SELECT signal.

5. The semiconductor die of claim 2, wherein each of the plurality of external control signal input connections are adapted to receive a CLOCK ENABLE signal.

6. The semiconductor die of claim 2, wherein each a first plurality of the external control signal input connections are adapted to receive CHIP SELECT signals and a second plurality of the external control signal input connections are adapted to receive CLOCK ENABLE signals.

7. The semiconductor die of claim 6, wherein the enable input connection comprises two connections, one adapted to receive a CHIP SELECT signal and one adapted to receive a CLOCK ENABLE signal.

8. The semiconductor die of claim 1, wherein each of the internal control signal input connections are further coupled to a substrate of the semiconductor die.

9. The semiconductor die of claim 8, wherein the substrate is adapted to be weakly biased to a ground potential.

10. A stacked die semiconductor component, comprising:
 a substrate having a plurality of external component control connections and a plurality of internal component control connections; and
 a plurality of semiconductor die arranged substantially vertically above the substrate, each including
  a functional circuit having an enable input connection,
  a plurality of external control signal input connections, each coupled to one of the external component control connections of the substrate,
  a plurality of internal control signal input connections, and
  a decode circuit having a first plurality of inputs each coupled to one of the external control signal input connections, a second plurality of inputs each coupled to one of the internal control signal input connections, and an output coupled to the enable input connection of the functional circuit, wherein the decode circuit is adapted to couple one signal coupled to the external control signal input connections to the output based on signals coupled to the internal control signal input connections of the decode circuit, and wherein the signals coupled to the internal control signal input connections are indicative of the semiconductor die's location in a stacked die structure.

11. The stacked die semiconductor component of claim 10, wherein the component comprises a memory component.

12. The stacked die semiconductor component of claim 11, wherein the memory component comprises a random access memory component.

13. The stacked die semiconductor component of claim 10, wherein the external component control connections comprise CHIP SELECT signal connections.

14. The stacked die semiconductor component of claim 13, wherein the external component control connections comprise CLOCK ENABLE signal connections.

15. The stacked die semiconductor component of claim 10, wherein the external component control connections comprise CHIP SELECT and CLOCK ENABLE signal connections.

16. The stacked die semiconductor component of claim 10, wherein each of the plurality of semiconductor die are adapted to be weakly biased to a ground potential.

17. The stacked die semiconductor component of claim 10, wherein internal component control connections of the substrate are adapted to be biased to a potential above ground potential.

18. The stacked die semiconductor component of claim 10, wherein connections between the plurality of semiconductor die comprise microballs.

19. The stacked die semiconductor component of claim 10, wherein connections between the plurality of semiconductor die comprise wire bonds.

20. The stacked die semiconductor component of claim 10, wherein each decode circuit on each of the plurality of semiconductor die receives a different pattern of internal control signal input connections.

21. The stacked die semiconductor component of claim 10, wherein the functional circuit of each of the plurality of semiconductor die comprise the same functional circuit.

22. The stacked die semiconductor component of claim 10, wherein microballs are used to couple connections from the substrate to each of the plurality of semiconductor die.

23. The stacked die semiconductor component of claim 10, wherein wire bonds are used to couple connections from the substrate to each of the plurality of semiconductor die.

24. The stacked die semiconductor component of claim 10 comprising four (4) semiconductor die.

25. A semiconductor die, comprising:
 a functional circuit having an enable input connection;
 a plurality of external control signal input connections;
 a plurality of internal control signal input connections; and
 a decoder for routing a signal coupled to one of the external control signal input connections to the functional circuit enable input connection based on a pattern of input signals coupled to the plurality of internal control signal input connections, wherein the pattern of input signals is indicative of the semiconductor die's location in a stacked die structure.

26. A stacked die semiconductor component, comprising a plurality of semiconductor die in accordance with claim 25.

27. The stacked die semiconductor component of claim 26, further comprising a base for coupling external control signals from outside the semiconductor component to the external control signal input connections.

28. The stacked die semiconductor component of claim 26, wherein the base further comprises means for providing a first logic signal level to the internal control signal input connections on a first of the plurality of semiconductor die.

* * * * *